(12) United States Patent
Inomata

(10) Patent No.: US 6,857,172 B2
(45) Date of Patent: Feb. 22, 2005

(54) METHOD OF MANUFACTURING FERROELECTRIC CAPACITOR

(75) Inventor: Daisuke Inomata, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 391 days.

(21) Appl. No.: 10/013,691

(22) Filed: Dec. 13, 2001

(65) Prior Publication Data

US 2003/0051324 A1 Mar. 20, 2003

(30) Foreign Application Priority Data

Sep. 18, 2001 (JP) ........................................ 2001-283019

(51) Int. Cl.$^7$ ................................................ H01G 7/00
(52) U.S. Cl. ...................... 29/25.41; 29/592.1; 29/609; 29/832; 29/851; 257/306; 257/310; 257/528; 257/532; 427/79; 427/80; 429/72; 429/79; 429/226; 429/372.2; 361/301.4; 361/308.1; 361/311; 361/312; 361/313; 361/761
(58) Field of Search ........................... 29/25.41, 592.1, 29/609, 832, 851; 361/311–313, 301.4, 308.1, 761–764; 427/79, 80; 257/306, 310, 528, 532; 429/72, 79, 226, 372.2

(56) References Cited

U.S. PATENT DOCUMENTS

| | | | |
|---|---|---|---|
| 5,206,788 A | * | 4/1993 | Larson et al. ................ 361/313 |
| 5,439,845 A | * | 8/1995 | Watanabe et al. ............ 438/396 |
| 5,523,595 A | * | 6/1996 | Takenaka et al. ............ 257/295 |
| 5,840,614 A | * | 11/1998 | Sim et al. .................... 438/464 |

FOREIGN PATENT DOCUMENTS

| | | | | |
|---|---|---|---|---|
| JP | 08340084 | | 12/1996 | |
| JP | 09069614 | | 3/1997 | |
| JP | 09153597 | | 6/1997 | |
| JP | 10270646 | | 10/1998 | |
| JP | 2000223662 A | * | 8/2000 | ........... H01L/27/04 |

OTHER PUBLICATIONS

"Fatigue characteristics of PZT thin films prepared by low thermal budget process"; Dong–Gun Lim; Young Park; Sang–Il Moon; Junsin Yi; Applications of Ferroelectrics, 2000. ISAF 2000; Jul. 21–Aug. 2, 2000; pp. 599–602.*

* cited by examiner

Primary Examiner—Paul D Kim
(74) Attorney, Agent, or Firm—Donald R. Studebaker; Nixon Peabody, LLP

(57) ABSTRACT

According to the present invention, a method of manufacturing a ferroelectric capacitor using a ferroelectric thin film, includes steps of: forming a lower conductive layer on a semiconductor substrate; coating solution of ferroelectric coking including organic solvent and organometallic complex on the lower conductive layer; performing a heating process for coated solution at temperature, to decompose said organometallic complex in solution of ferroelectric coking, or more and ferroelectric crystallization temperature or below to form said metal compound thin film; forming an upper conductive layer on said metal compound thin film; and performing a heating process for said metal compound thin film at ferroelectric crystallization temperature or more to form said ferroelectric thin film.

18 Claims, 9 Drawing Sheets

METHOD OF MANUFACTURING FERROELECTRIC CAPACITOR

BACKGROUND OF THE INVENTION

1. Field of the Invention

The present invention relates to a method of forming an oxide substance dielectrode thin film, and more particularly a method of manufacturing a ferroelectric capacitor using an oxide ferroelectric material.

2. Description of the Related Art

Material by using $SrBi_2Ta_2O_9$, which is Bi based layer compound (hereinafter, a material in which composition is changed and a series of compound groups to which an addition substance is added or replaced are referred to as SBT) or $Pb(Zr_{1-x}Ti_x)O_3$, which is titanic acid zirconate (hereinafter, a material in which composition of the compound is changed and a series of compound groups to which addition such as La or Ca is added are referred to as PZT) is currently put practical in use as a ferroelectric material used in a ferroelectric capacitor.

A memory using ferroelectric capacitors has an advantage in that an operation is available with 5V or below without an internal increase pressure circuit, which is essential for the above non volatile memory while the memory has the same function as a non volatile memory as represented in a flash memory or an EEPROM.

In particular, generally resistance of an electric field of a SBT lowers and the SBT is superior in a saturated characteristic for an electric filed of a residual polarization of the SBT compared with the resistance of the electric field and the saturated characteristic of a PZT as a ferroelectric material. Thereby, it is deemed that the SBT is suitable for a low voltage operation.

The residual polarization value of the PZT rapidly lowers with thinner film than film of 3000 Å. The PZT shows clearly film thickness independency as aforementioned. Therefore, the PZT has a drawback that practical in use of a device to operate with a voltage, which is below 5V is difficult. In contrast, since the film thickness dependency of the SBT lowers compared with the PZT, the SBT has an advantage that the SBT is easily applied to a device as purpose of low voltage operation.

In fact, when the film thickness is gradually thin as purpose of low voltage operation in the SBT, a big problem in which a resist pressure for an impressed voltage is rapidly decreased occurs. It is deemed that as this reason, a trough and peak on a surface of the SBT is greatly related as shown in FIG. 1.

FIG. 1 is a SEM photo of a ferroelectric capacitor in a conventional art, which sandwiches a SBT film by Pt electrodes. The trough and peaks on the surface reflects the trough and peak of the SBT film and an upper Pt electrode film goes into a space of the SBT film. Due to the troughs and peaks on the surface of the SBT, an extreme thin portion of a local area appears in the SBT film and an electric field is concentrated on that portion. As a result of this, break-down voltage of the film is greatly decreased.

Roughness of the trough and peak on the surface of the SBT film is a common feature of a crystal structure of Bi based layer compound and roughness is ascribed to anisotropy of a crystal growing speed. In a conventional formation method of the SBT film, generally coking solution is made by a sol-gel method or by an organometallic decomposition method (MOD method), coking solution is coated on a substrate by a spin coat method, and an anneal step is perform at crystallization temperature. When a film with thickness around 150 nm is formed by this method, a difference between the trough and the peak of the film reaches 100 nm or more.

In general, when a ferroelectric film with desired thickness of 100 nm to 300 nm is formed by the spin coat method, a ferroelectric characteristic is improved and thereby any steps from a coating step to a crystallization heating step are repeated from twice to sixth times. When steps from the coating step to an organic solvent drying step, which have been reported are repeated, multiple spaces occur in the ferroelectric film at a time of a ferroelectric crystallization heating process and, therefore, there is a problem that a high quality film can not be formed. A metal organic substance can not be decomposed sufficiently in the heating process around 250° C. of which purpose is dry of organic solvent and in the film, the metal organic substance remains as it is. In that state, when the film is stacked and becomes thick, it is difficult to eliminate the metal organic substance from the organic film at a time of crystallization anneal after the film becomes thick and multiple spaces occur in the film from anisotropy of film contraction at a time of crystallization. As a result, leak resist pressure of the ferroelectric capacitor is reduced and a residual polarization value also lowers. Japanese Patent Application Laid-Open No. H8-340084 discloses that steps from a coating step to a drying step are repeated and therefore the aforementioned problem is apprehended. Similarly, Japanese Patent Application Laid-Open No. H9-69614 discloses that the multilayered film is formed in steps from the coating step to the drying step. Japanese Patent Application Laid-Open No. H9-153597 has a similar problem and proposes that a reduction pressure anneal method is used. However, cost for an apparatus is extremely expensive with respect to reducing a pressure of oxide with high temperature of 700° C. to 800° C. and, thereby the method is not suitable for mass manufacture.

There is a problem that only anneal step in a short time of a few minutes using a rapid heating method (RTA) can not obtain the ferroelectric characteristic sufficiently in a method to repeat a series of steps from the coating step to the heating step to decompose the organic substance or a series of steps from the coating step to the crystallization heating step (Japanese Patent Application Laid-Open No. H10-270646 discloses this method).

Though it is possible to suppress the growing of a grain by accelerating temperature increase rate using the RTA in some ranges and by dense crystallization nucleation of the ferroelectric film, there is a problem that a sufficient characteristic of the ferroelectric film can not be obtained when a heating time to crystallize the film is short. When the heating time in the RTA is simplify long to improve the film's characteristic, throughput becomes greatly worsen from a characteristic of an apparatus, a single wafer process and thereby, the method is not suitable for mass manufacture.

SUMMARY OF THE INVENTION

Therefore, it is an object of the present invention to provide a method of forming a ferroelectric film, and more particular to provide a method of forming a thin film, with a high quality characteristic using Bi based material. According to the present invention, a ferroelectric characteristic included in the SBT film is sufficiently obtained, simultaneously, roughness of a trough and peak on a surface can be reduced. A resist pressure against a film's electric field can highly be improved by improving film's flatness. As a result, a thin film, of the ferroelectric film with thickness, of 100 nm or below can be obtained and a ferroelectric capacitor capable of low voltage operation with a voltage, which is 2V or below can be formed.

According to the present invention, a method of manufacturing a ferroelectric capacitor using a ferroelectric thin film, includes steps of: forming a lower conductive layer on a semiconductor substrate; coating solution of ferroelectric coking including organic solvent and organometallic complex on the lower conductive layer; performing a heating process for coated solution at temperature, to decompose the organometallic complex in solution of ferroelectric coking, or more and ferroelectric crystallization temperature or below to form the metal compound thin film; forming an upper conductive layer on the metal compound thin film; and performing a heating process for the metal compound thin film at ferroelectric crystallization temperature or more to form the ferroelectric thin film.

The summary of the invention does not necessarily describe all necessary features of the present invention. The present invention may also be a sub-combination of the features described above. The above and other features and advantages of the present invention will become more apparent from the following description of the embodiments taken in conjunction with the accompanying drawings.

DETAILED DESCRIPTION OF THE INVENTION

Figure 1:
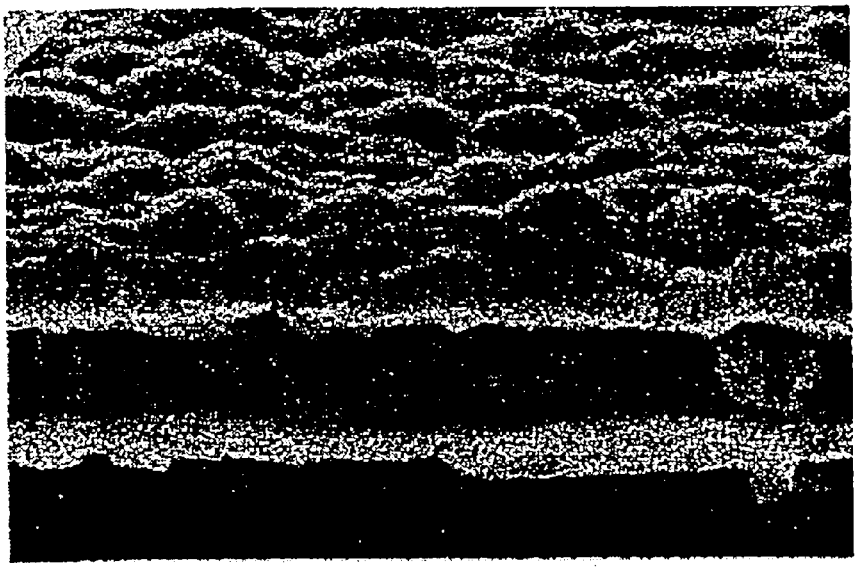
FIG. 1 is a SEM photo of a surface of a capacitor in a conventional art.
Figure 1:
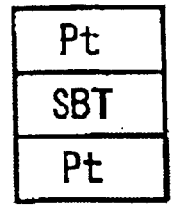

The invention will now be described based on preferred embodiments, which do not intend to limit the scope of the present invention, but rather to exemplify the invention. All of the features and the combinations thereof described in the embodiments are not necessarily essential to the invention.
(First Embodiment)

In a first embodiment, a method of manufacturing a ferroelectric capacitor to realize superior flatness will be described by a SBT, which a ferroelectric material as one example of a dielectric oxide material of a ferroelectric capacitor referring to a flowchart of a step in FIG. 2. The method can similarly be applied to the other $B_i$ based materials other than the SBT (e.g., titanic acid bismuth, material to put addition, or a series of compound groups which one part of composition is replaced with a different element).

A Pt layer, which a lower electrode of a capacitor on a substrate is formed with a film of approximately 50 nm to 400 nm by a DC sputter method. SBT coking solution made by a MOD method or a sol-gel method is coated on the Pt layer by a spin coat method (S10 in FIG. 2). With respect to a method of forming the SBT, a LSMCD (liquid source misted chemical deposition) method to use a mist coking instead of the spin coat method.

A rotational speed of a substrate at a time of spin coat is approximately 500 rpm to 4000 rpm and a ferroelectric's film is coated with a desired thickness. After the film is coated, a heating process is performed at 120° C. to 250° C. for 2 to 6 minutes to dry an organic solvent in solution of SBT coking with a hot plate etc. (S11 in FIG. 2). It is necessary that temperature in this drying process is a temperature, to vaporize organic solvent in solution of SBT coking used to coat solution, or more. It is general that butyle acetate (vaporization temperature is 40° C. to 100° C.), 1-methoxy 2-propanol (vaporization temperature is 40° C. to 110° C.), or 2-methoxyethanol (vaporization temperature is 40° C. to 110° C.) is used as organic solvent.

The heating process is performed at 120° C. or more for a few minutes by which it is possible to completely dry organic solvent. After organic solvent is dried, sequentially, the heating process to decompose organic substances included in the film is performed at 450° C. to 550° C. for five minutes by the hot plate (electric furnace, lamp superheating, a RTA may be used) (S12 in FIG. 2). It is preferable that this temperature is a suitable temperature according to organic substance decomposition temperature of coking solution. In most of cases, an included organic material is organometallic complex (or metallic alkoxide) and various materials can be applied. For example, decomposition temperature is around 340° C.±10° C. in carboxylate and decomposition of carboxylate is sufficiently available by the heating process at 450° C. or more for five minutes.

In this process (S12 in FIG. 2), it is important that the heating process for a ferroelectric's thin film is performed at decomposition temperature of an organic substance or more and crystallization temperature of the ferroelectric or below. When the heating process for this thin film is performed at crystallization temperature or more, a difference between of a trough and peak on a film surface rapidly becomes large with the growing of the grain. Therefore, each level of the difference between the trough and peak on the surface of the film are changed depending on a type of the included organic substrate or a component of the ferroelectric material. In this case, heating process temperature and time can be set to a suitable condition by crystallization analysis using differential thermal analysis (DTA) or X-ray diffraction. A heating process to decompose the included organic substrate by the heating process at crystallization temperature or below is called as "preliminary anneal".

In conventional manufacturing method, after preliminary anneal (S12 in FIG. 2) is made or after the preliminary anneal step is omitted and a drying step (S11 in FIG. 2) is made, the heating process to crystallize the SBT (s14 in FIG. 2) is carried out in oxide at approximately 650° C. to 800° C. A series of steps from this coating step to the crystallization anneal step is repeated at several times and a thin layer of ferroelectric (SBT) with thickness of 50 nm to 300 nm is formed. After that, a Pt layer is formed as an upper electrode of the capacitor (S13 in FIG. 2).

Figure 2:
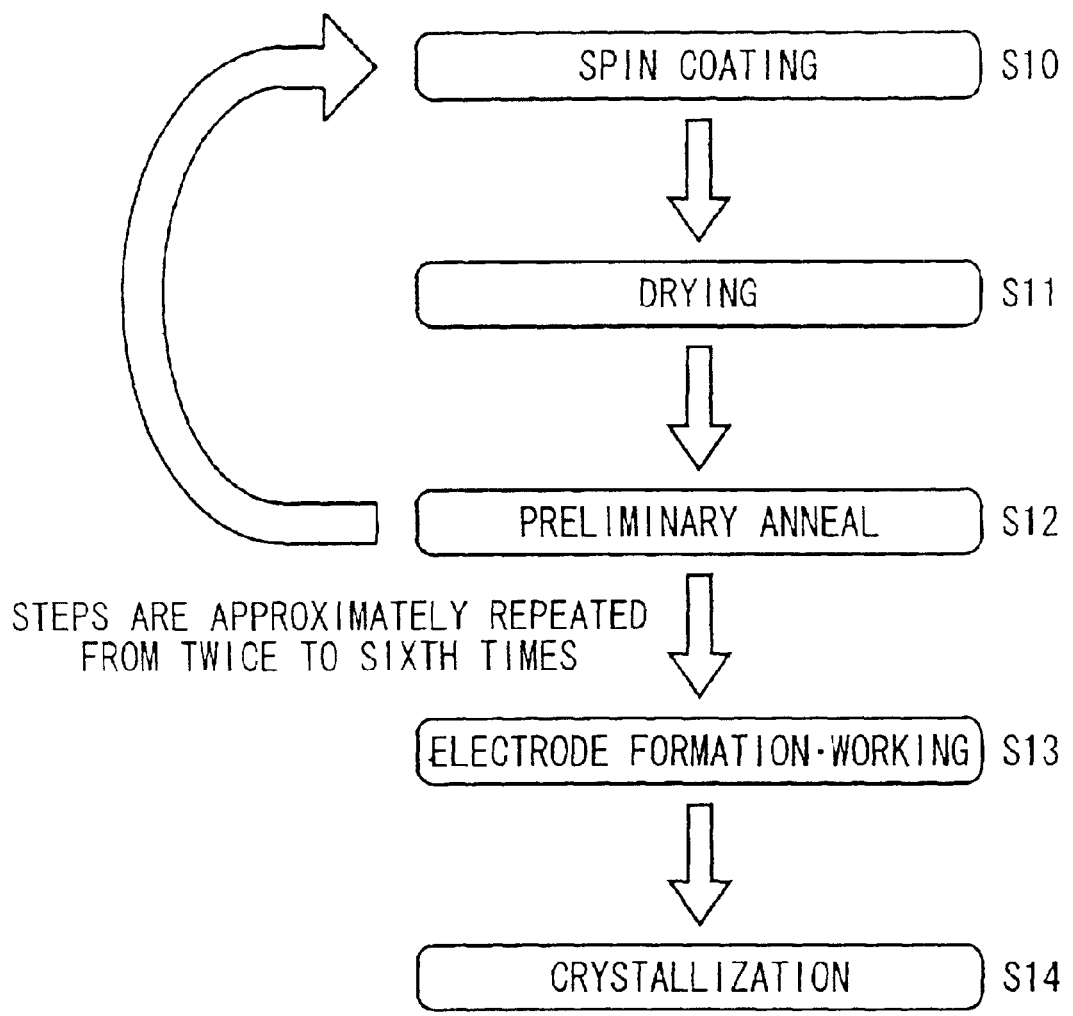
FIG. 2 is a flowchart of a substantially step to explain a first embodiment.

In a first embodiment, after steps from the coating step (S10 in FIG. 2) to the preliminary anneal step (S12 in FIG. 2) as aforementioned are repeated at twice to sixth times, the upper electrode is formed (S13 in FIG. 2). The number of repeating times is adjusted according to a desired thickness. It is preferable that formation of a film of 100 nm is completed around fourth times when the film of 100 nm is formed.

As the upper electrode of the ferroelectric capacitor, the Pt layer with the film of 50 nm to 400 nm is formed in, for example, the DC sputtering method (S13 in FIG. 2). Next, the upper electrode is worked by the known photolithography step and the etching step. Normally, after that, the ferroelectric film is worked and then the lower electrode is worked. The ferroelectric film and the lower electrode are worked by the known photolithography step and the etching step.

The upper electrode is worked. And then, it is possible to perform the crystallization anneal step of the ferroelectric film (S14 in FIG. 2) after the ferroelectric film is worked or the electrode is worked. Preferably, the ferroelectric film is performed after the electrode is worked. This is because one part of the ferroelectric film is exposed after the upper electrode is worked, sufficient oxide can be supplied to the ferroelectric film at a time of the crystallization anneal, and characteristic inferior of the ferroelectric film is suppressed.

Although the crystallization anneal step (S14 in FIG. 2) can be performed before the upper electrode is worked, in this case where there is probability the film on interfaces of the Pt film and the ferroelectric film come off. This tendency becomes sure according to thick of the Pt film, which is the upper electrode.

From a view of ensurance of a residual polarization in the ferroelectric film and prevention of coming off the upper electrode, it is preferable to perform the crystallization anneal step (S14 in FIG. 2) after the upper electrode is worked (S13 in FIG. 2). In the crystallization anneal step, the step is performed at 650° C. to 800° C. for 30 to 60 minutes by using the electric furnace.

Figure 3:
FIG. 3 is the SEM photo of a surface of a capacitor to which the first embodiment is applied.

FIG. 3 is the SEM photo of a ferroelectric capacitor formed in the first embodiment. As obvious from comparison the ferroelectric capacitor in FIG. 3 with the SBT film with thickness of 110 nm and the ferroelectric capacitor of 690000 um2 formed in the conventional manufacturing method shown in FIG. 1, flatness of the SBT film is extremely improved. It is confirmed by the observation with AFM that the difference between the trough and peak is reduced to one-third or below in comparison a different step of 30 nm or below with a conventional different step of 100 nm.

As a result of this, in the ferroelectric capacitor of 690000 um2 with the SBT film of thickness of 110 nm formed by a conventional manufacturing method, a yield factor for resist pressure of 1V in 48 chips on a wafer face is 0%. In contrast, in the first embodiment, a result of 100%, the yield factor can be obtained in the ferroelectric capacitor of which the SBT film is thickness of 94 nm.

Figure 4:
FIG. 4 is the SEM photo of a sectional face of the capacitor to which the first embodiment is applied.
Figure 4:
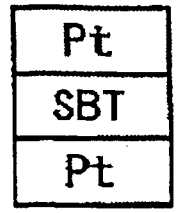

FIG. 4 is the SEM photo of a sectional face of the ferroelectric capacitor formed in the present. Flatness of the film in the upper electrode can be confirmed.

(Second Embodiment)

Figure 5:
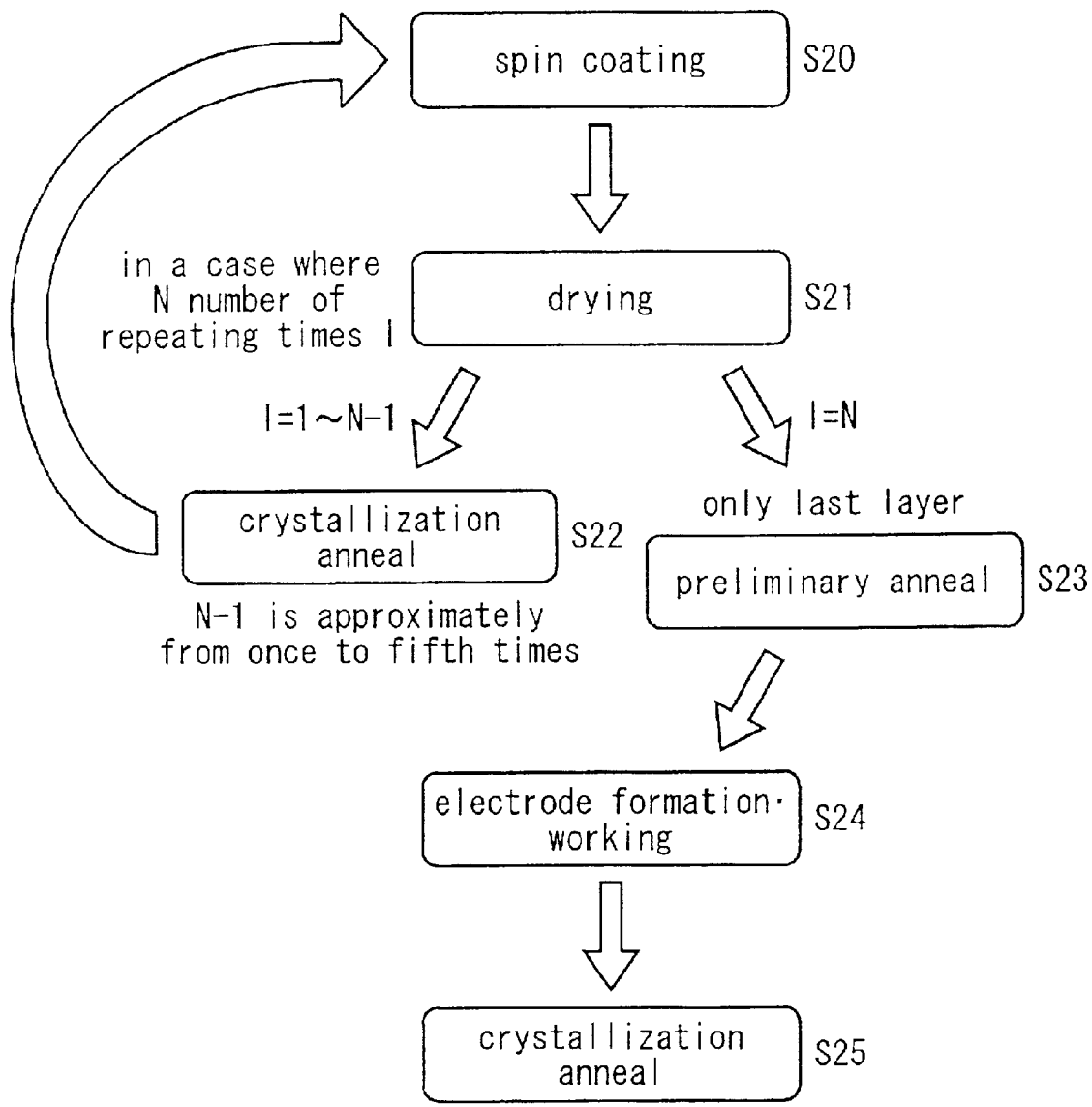
FIG. 5 is a flowchart of a substantially step to explain a second embodiment.

In the first embodiment, after the SBT film is stacked on the lower electrode at the several times in the preliminary anneal, the upper electrode is formed and crystallized. In a second embodiment, FIG. 5 is a flowchart of a step to explain the second embodiment.

In the second embodiment, two type's anneal steps are mixed and used. The steps are the same as steps in the first embodiment, that is, the steps are steps in which the lower electrode is formed on the substrate, solution of SBT coking is coated (S20 in FIG. 5), and then coated solution is dried (S21 in FIG. 5). In the first embodiment, "preliminary anneal" is carried out at crystallization temperature or below, which crystallization of the SBT film occurs. In contrast, "crystallization anneal" (S22 in FIG. 5) is carried out at crystallization temperature or more in the second embodiment.

From the SBT coating step to the crystallization anneal step, when the coating step is repeated at fourth times, the crystallization anneal step (S22 in FIG. 5) is carried out from once to third times and "preliminary anneal" is carried out at the last time.

Therefore, when the N number of coating times is repeated, the crystallization anneal step around 650° C. to 800° C. for 10 to 60 minutes by using electric furnace is performed for the coating step at the N−1 times. For the SBT layer formed in the last coating step "preliminary anneal" (S23 in FIG. 5) of the same condition as condition in the first embodiment is performed at the last time. After that, the upper electrode is formed and the etching working of its upper electrode (S24 in FIG. 5) is performed. Then, the crystallization anneal step (S25 in FIG. 5) similar to the crystallization anneal step (S14 in FIG. 2) in the first embodiment is performed.

In the first embodiment, since a status of the entire SBT layer is a status of "preliminary anneal", there is possibility that the film is contracted at a time of the crystallization anneal step. In the present embodiment, rate of film thickness, in a "preliminary anneal" stage, for the SBT film's thickness can be reduced, a degree of film contraction can be reduced, as a result, a space at a center part of the SBT film can be prevented, and difference of rough density can be reduced.

Figure 6:
FIG. 6 is a SEM photo of a sectional face of a capacitor to which the first embodiment is applied.
Figure 6:
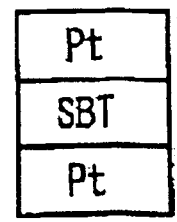

FIG. 6 is a SEM photo of a sectional face a ferroelectric capacitor formed in the present embodiment. The space at the center part of the SBT film can be suppressed and difference of roughness over the entire film can be reduced.

With respect to a characteristic of the SBT film, flatness of the SBT film is the same as flatness in the first embodiment. A resist pressure of the ferroelectric capacitor is absolutely the same as the pressure in the first embodiment. With respect to the residual polarization characteristic in the ferroelectric capacitor, 2Pr value is 10.6 $\mu C/cm2$ (crystallization anneal temperature 750° C.) in the first embodiment. In contrast, the value is 13.8 $\mu C/cm2$ (crystallization anneal temperature 750° C.), that is, it is confirmed that 30% is increased.

(Third Embodiment)

In the first and second embodiments, there are features in the "preliminary anneal" step in formation of the ferroelectric. In the "preliminary anneal" step, flatness can highly be improved. In a third embodiment, a manufacturing method using an RTA is provided. According to this method, formation of the ferroelectric film becomes possible without formation of the space in the ferroelectric film.

The present embodiment is conceptually different from the first and second embodiments in the step of forming the ferroelectric film. In particular, they are different each other in a point in which the ferroelectric crystallization is performed before the upper electrode is formed. However, in the present embodiment, anneal step is stopped before a ferroelectric grain is grown and difference of height between the trough and peak exceeds 40% of thickness of the ferroelectric film.

Hereinafter, this step is referred to as "amorphous". Below, a manufacturing method will be described referring to a flowchart of a step in FIG. 7.

Figure 7:
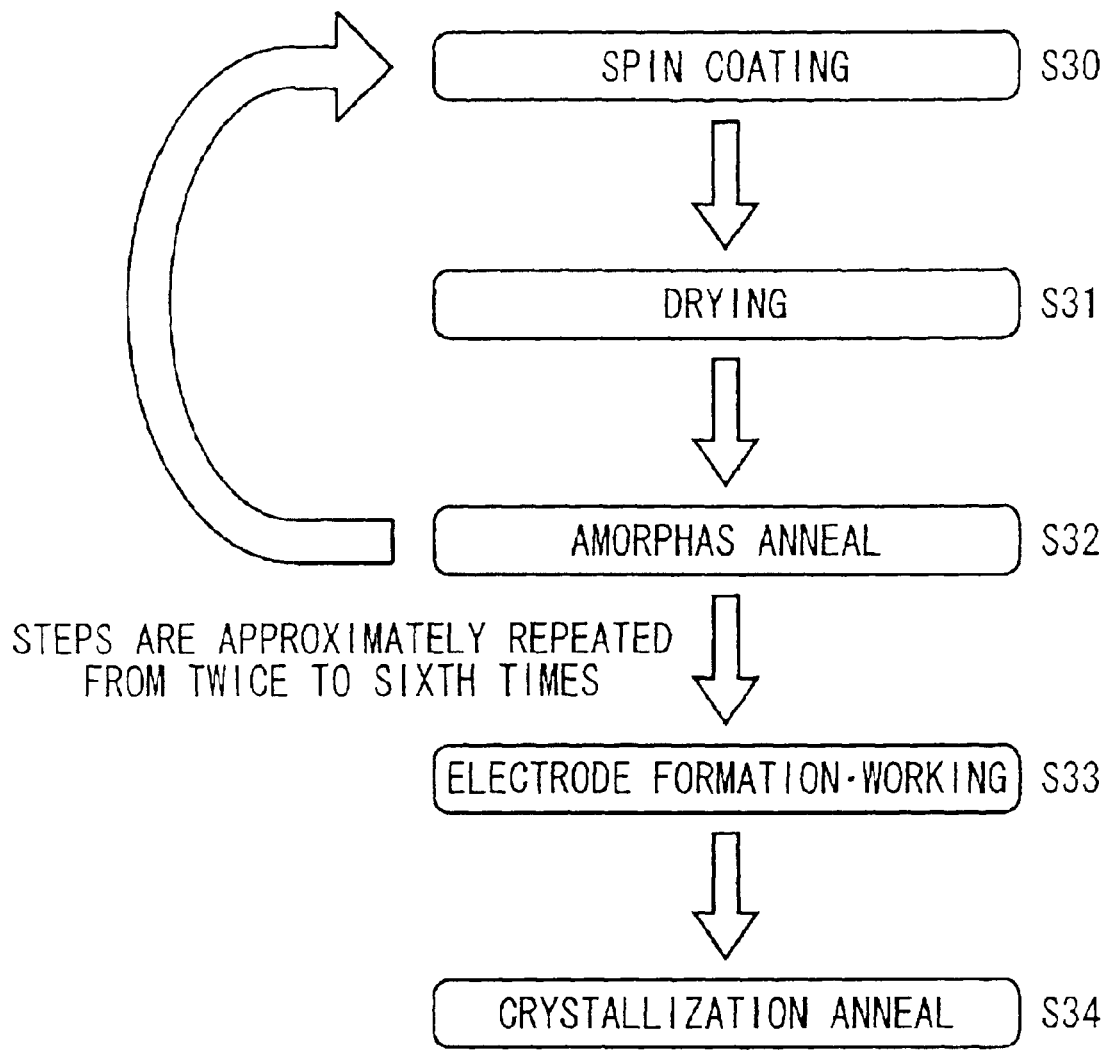
FIG. 7 is a flowchart of a substantially step to explain a third embodiment.

The steps in the third embodiment are the same as the steps in the first and second embodiments, that is, the steps are steps in which firstly the lower electrode of the ferroelectric capacitor is formed on the substrate, solution of SBT coking is coated (S30 in FIG. 7) and next coated solution is dried (S31 in FIG. 7). After that, "amorphous" heating process (S32 in FIG. 7) of which temperature is around 700° C. to 750° C. and anneal is performed around 30 seconds to 3 minutes is performed. It is necessary to confirm crystallization of the SBT film by using XRD analysis. By SEM observation or AFM measurement, suitability of temperature and time for heating process of amorphous is important from view of flatness of the SBT film. The steps from coating step of solution of SBT coking (S30 in FIG. 7) to an amorphous step (S32 in FIG. 7) is repeated from twice to sixth times until film's thickness becomes desired thickness. The number of repeating times is not specially limited. After that, the Pt layer is formed as the upper electrode of the ferroelectric capacitor. Similar to the aforementioned embodiments, after the etching working of its upper electrode (S33 in FIG. 7) is performed, the sufficient crystallization anneal step (S34 in FIG. 7) is performed.

Figure 8:
FIG. 8 is a SEM photo of a sectional face of a capacitor to which the third embodiment is applied.
Figure 8:
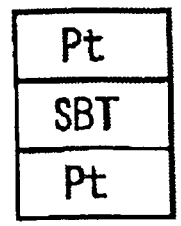

FIG. 8 is a SEM photo of a sectional face of a ferroelectric capacitor obtained in the third embodiment. The space in the SBT film, which occurs in the first and second embodiments is greatly suppressed. In addition, flatness is slightly inferior compared with the aforementioned embodiment. However, with respect to yield factor of resist pressure, it is confirmed that there is no problem specially even with film thickness is 94 nm. Further, 2Pr value of the ferroelectric capacitor obtained in the present embodiment is 14.0 $\mu C/cm2$ (crystallization anneal temperature 750° C.) and the more preferable result in the present embodiment than the result in the first and second embodiments is obtained.

(Fourth Embodiment)

Figure 9:
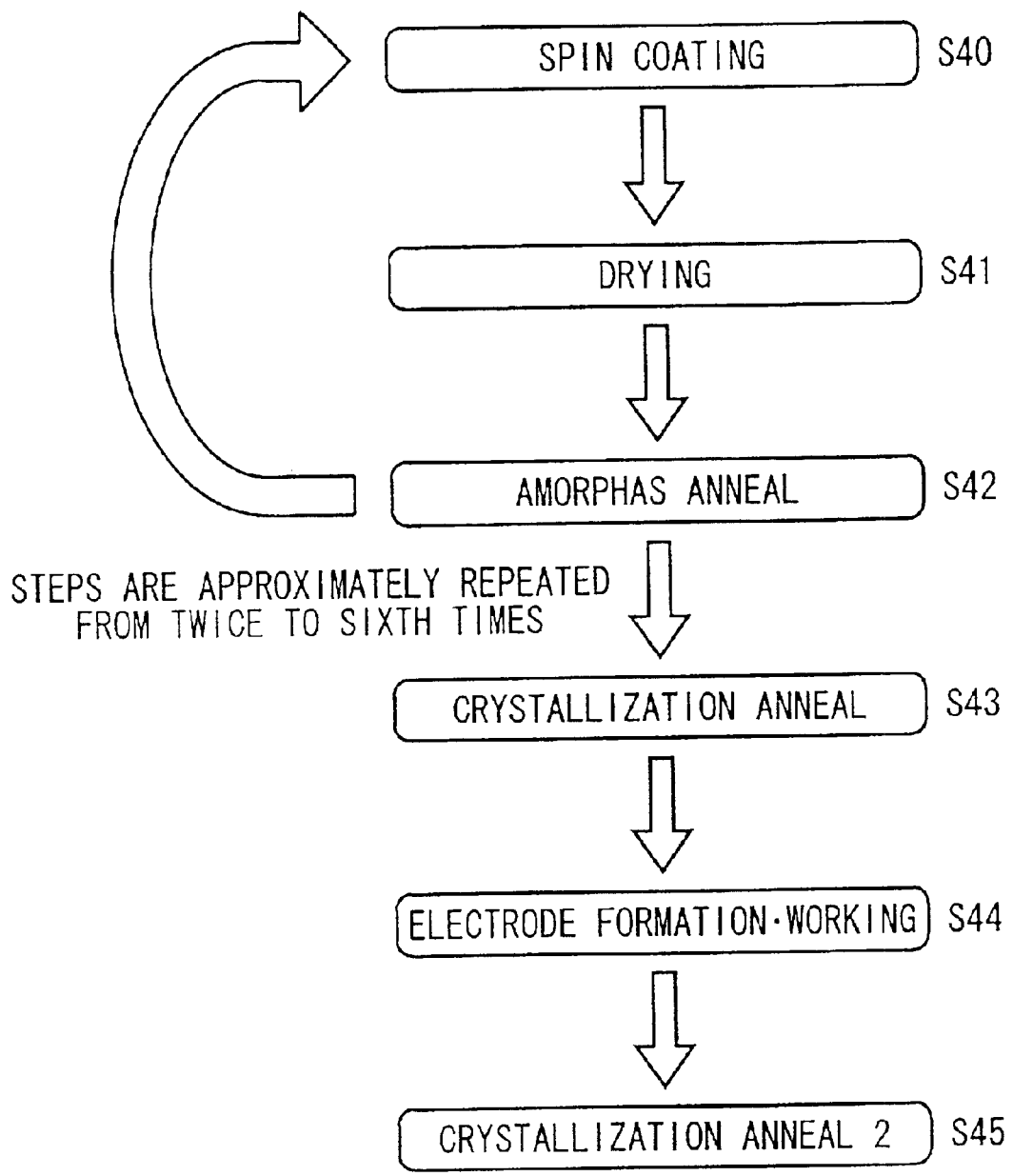
FIG. 9 is a flowchart of a substantially step to explain a fourth embodiment.

The present embodiment is an embodiment to which modification is further added. In the third embodiment, the amorphous step is performed by the RTA in the step of forming the ferroelectric. An object in the third embodiment is mainly to miniaturize a grain's size of the SBT crystallization as much as possible. In the present embodiment, an object is to highly improve the ferroelectric characteristic such as residual polarization characteristic of the ferroelectric capacitor nevertheless flatness is slightly inferior compared with flatness in the third embodiment. Below, a manufacturing method in the present embodiment will be described referring to a flowchart of a step in FIG. 9.

Steps in which the lower electrode is formed on the substrate, SBT solution is coated (S40 in FIG. 9) and coated solution is dried (S41 in FIG. 9) are the same as the steps in the first to third embodiments. After that, "amorphous" heating process (S42 in FIG. 9) of which anneal is performed around 30 seconds to 3 minutes is performed around 650° C. to 750° C. by the RTA. Steps from the coating steps (S40 in FIG. 9) to the amorphous step (S42 in FIG. 9) are repeated from twice to sixth times until film's thickness becomes desired thickness. The above step's flow is the same as flow in the third embodiment. In the present embodiment, in the electric furnace, an oxide heating process (S43 in FIG. 9) is added at 650° C. to 800° C. around 30 to 120 minutes.

After that, the Pt layer is formed as the upper electrode. Similar to the aforementioned embodiments, after the upper electrode is formed and the etching working (S44 in FIG. 9) is performed, the crystallization anneal step (S45 in FIG. 9) is again performed. In the present embodiment, the crystallization anneal step (S45 in FIG. 9) after working of the upper electrode can be omitted.

In the third embodiment, only the oxide heating process (S32 in FIG. 7) is performed around 30 seconds to 3 minutes. The heating process is not sufficient for the crystallization step of SBT crystallization and the oxide processes. After working of the upper electrode (S33 in FIG. 7), crystallization anneal step (S34 in FIG. 7) is performed. However, since the upper of the ferroelectric capacitor is covered with the Pt electrode layer, oxide reaction of the SBT proceeds by oxide which permeability diffusion of the Pt layer is performed. It is predicted that there is an oxide process inserted from the upper electrode end.

However, the longer the crystallization anneal time, the more the ferroelectric characteristic represented in the 2Pr value of the ferroelectric capacitor is improved. Such tendency appears. It is understood that efficiency of the oxide process by this method is terrible.

In this embodiment, a SBT film with high crystallization nucleation density is formed in a RTA processing (S42 in FIG. 9) as a first stage. After that, oxide is directly supplied to a SBT surface by the electric furnace and efficient oxide reaction is facilitated (S43 in FIG. 9). At this time, though the grain is grown, crystallization nucleation density is greatly high. Thereby, a degree to grow the grain is comparatively slow. This feature is paid attention in the present embodiment. Therefore, superior flatness is maintained, simultaneously, 16.4 $\mu C/cm2$ by the 2Pr value (crystallization anneal temperature 750° C.) can be obtained and the ferroelectric capacitor with the most preferable ferroelectric characteristic in the embodiments of the present invention can be obtained.

Although the present invention has been described by way of exemplary embodiments, it should be understood that those skilled in the art might make many changes and substitutions without departing from the spirit and the scope of the present invention which is defined only by the appended claims.

What is claimed is:

1. A method of manufacturing a ferroelectric capacitor comprising:
    preparing a semiconductor substrate;
    forming a lower conductive layer on the semiconductor substrate;
    forming a ferroelectric film on the lower conductive layer, the forming of the ferroelectric film further including:
        coating a solution including a ferroelectric material and an organic solvent on the lower conductive layer;
        subjecting the coated solution to heat treatment so as to evaporate the organic solvent;
        subjecting the ferroelectric material to an amorphous anneal that is not sufficient for crystallization, and repeating the coating, the heat treatment and amorphous anneal at least one time;
    subjecting the ferroelectric film to a first crystallization anneal that is sufficient for crystallization; and
    forming an upper conductive layer on the ferroelectric film.

2. The method of manufacturing a ferroelectric capacitor according to claim 1, further comprising subjecting the upper conductive layer to a second crystallization anneal.

3. The method of manufacturing a ferroelectric capacitor according to claim 1, wherein the coating is conducted by a spin coating method.

4. The method of manufacturing a ferroelectric capacitor according to claim 1, wherein the coating is conducted by a liquid source misted chemical deposition method.

5. The method of manufacturing a ferroelectric capacitor according to claim 1, wherein the heat treatment is conducted at about 120° C. to 250° C. in approximately 2 to 6 minutes.

6. The method of manufacturing a ferroelectric capacitor according to claim 1, wherein the ferroelectric material includes at least a compound selected from the group of Bi based layer compound and titanic acid zirconate.

7. The method of manufacturing a ferroelectric capacitor according to claim 1, wherein the organic solvent includes at least a solvent selected from the group of butyle acetate, 1-methoxyethanol and 2-methoxyethanol.

8. The method of manufacturing a ferroelectric capacitor according to claim 1, wherein the amorphous anneal is conducted at about 700° C. to 750° C. in approximately 30 seconds to 3 minutes.

9. The method of manufacturing a ferroelectric capacitor according to claim 1, wherein the crystallization anneal is conducted at about 650° C. to 800° C. in approximately 30 to 120 minutes.

10. A method of manufacturing a ferroelectric capacitor comprising:

preparing a semiconductor substrate;

forming a lower conductive layer on the semiconductor substrate;

forming a stacked ferroelectric film on the lower conductive layer by repeating the following:

coating a solution including a ferroelectric material and an organic solvent on the lower conductive layer;

subjecting the coated solution to a heat treatment so as to evaporate the organic solvent, and subjecting the ferroelectric material to an amorphous anneal so that a difference between a trough and peak formed on the ferroelectric film does not exceed a thickness of the ferroelectric film;

subjecting the ferroelectric film to a first oxidation anneal that is sufficient for crystallization; and forming an upper conductive layer on the ferroelectric film.

11. The method of manufacturing a ferroelectric capacitor according to claim 10, further comprising subjecting the upper conductive layer to a second oxidation anneal.

12. The method of manufacturing a ferroelectric capacitor according to claim 10, wherein the coating is conducted by a spin coating method.

13. The method of manufacturing a ferroelectric capacitor according to claim 10, wherein the coating is conducted by a liquid source misted chemical deposition method.

14. The method of manufacturing a ferroelectric capacitor according to claim 10, wherein the heat treatment is conducted at about 120° C. to 250° C. in approximately 2 to 6 minutes.

15. The method of manufacturing a ferroelectric capacitor according to claim 10, wherein the ferroelectric material includes at least a compound selected from the group of Bi based layer compound and titanic acid zirconate.

16. The method of manufacturing a ferroelectric capacitor according to claim 10, wherein the organic solvent includes at least a solvent selected from the group of butyle acetate, 1-methoxyethanol and 2-methoxyethanol.

17. The method of manufacturing a ferroelectric capacitor according to claim 10, wherein the amorphous anneal is conducted at about 700° C. to 750° C. in approximately 30 seconds to 3 minutes.

18. The method of manufacturing a ferroelectric capacitor according to claim 10, wherein the oxidation anneal is conducted at about 650° C. to 800° C. in approximately 30 to 120 minutes.

* * * * *